(12) United States Patent
Ueda et al.

(10) Patent No.: US 12,098,028 B2
(45) Date of Patent: Sep. 24, 2024

(54) ARTICLE TRANSPORT FACILITY

(71) Applicant: Daifuku Co., Ltd., Osaka (JP)

(72) Inventors: Toshihito Ueda, Hinocho (JP); Sadato Matsugi, Hinocho (JP); Akira Suzuki, Hinocho (JP); Yoshitaka Tanaka, Hinocho (JP)

(73) Assignee: Daifuku Co., Ltd., Osaka (JP)

(*) Notice: Subject to any disclaimer, the term of this patent is extended or adjusted under 35 U.S.C. 154(b) by 422 days.

(21) Appl. No.: 17/469,002

(22) Filed: Sep. 8, 2021

(65) Prior Publication Data

US 2022/0073277 A1 Mar. 10, 2022

(30) Foreign Application Priority Data

Sep. 9, 2020 (JP) .................................. 2020-151437

(51) Int. Cl.
*B65G 1/04* (2006.01)
*B65G 1/133* (2006.01)
*B65G 1/137* (2006.01)

(52) U.S. Cl.
CPC ......... *B65G 1/0492* (2013.01); *B65G 1/0457* (2013.01); *B65G 1/133* (2013.01); *B65G 1/1373* (2013.01)

(58) Field of Classification Search
CPC .... B65G 1/0492; B65G 1/0457; B65G 1/133; B65G 1/1373; B65G 35/00; H01L 21/67276; H01L 21/67715; H01L 21/67727; H01L 21/67733
See application file for complete search history.

(56) References Cited

U.S. PATENT DOCUMENTS

| | | | | |
|---|---|---|---|---|
| 2012/0101667 | A1* | 4/2012 | Ikeya | H01L 21/67733 701/19 |
| 2013/0213755 | A1* | 8/2013 | Shibata | B61J 1/06 191/22 R |
| 2018/0222686 | A1* | 8/2018 | Takahara | H01L 21/67276 |
| 2021/0179153 | A1* | 6/2021 | Harasaki | B61L 27/30 |

FOREIGN PATENT DOCUMENTS

| | | | |
|---|---|---|---|
| JP | 2002046611 A | * 2/2002 | |
| JP | 2005284779 A | 10/2005 | |
| JP | 2018188287 A | * 11/2018 | ........... B65G 1/0492 |

OTHER PUBLICATIONS

English Translation of Kamimura (JP-2018188287) (Year: 2018).*

* cited by examiner

*Primary Examiner* — James M McPherson
*Assistant Examiner* — Kyle J Kingsland
(74) *Attorney, Agent, or Firm* — The Webb Law Firm

(57) ABSTRACT

A control device that performs control to manage the passage of article transport vehicles in a management zone can execute: basic processing for permitting a first article transport vehicle to enter the management zone if no article transport vehicle is present in the management zone, and prohibiting a second article transport vehicle from entering the management zone if the first article transport vehicle is present in the management zone; and first exception processing for permitting the second article transport vehicle to enter the management zone in a case where, even if the first article transport vehicle is present in the management zone, the first article transport vehicle is an article transport vehicle that stops at a station provided in the first path, and the second article transport vehicle passes through a second path and a third path but does not pass through the first path.

7 Claims, 11 Drawing Sheets

ARTICLE TRANSPORT FACILITY

CROSS-REFERENCE TO RELATED APPLICATION

This application claims priority to Japanese Patent Application No. 2020-151437 filed Sep. 9, 2020, the disclosure of which is hereby incorporated by reference in its entirety.

BACKGROUND OF THE INVENTION

1. Field of the Invention

The present invention relates to an article transport facility in which a region including a first path, a second path, a third path, and a connecting portion is set as a management zone in which entry of an article transport vehicle is managed.

2. Description of the Related Art

JP 2005-284779A discloses an article transport facility in which a section (i.e., a management zone) where entry of a plurality of article transport vehicles is exclusively controlled is set as a travel path, and passage of the article transport vehicles that enter the management zone is controlled by a zone controller (hereinafter, reference numerals in parentheses in the background section are those of the reference document). For example, FIG. 2 of JP 2005-284779A shows an example where a first path in which points (P1, P2) are set, a second path in which a point (P4) is set, and a third path in which a point (P5) is set are connected at a connecting portion (point (P3)), and a region including these points (P1 to P5) is set as a management zone that is to be subjected to exclusive control by a zone controller (30). If the zone controller (30) has permitted an article transport vehicle that travels through the second path from the first path via the connecting portion (P3) to enter the management zone, entry of other article transport vehicles that travel through the third path into the management zone is prohibited. Thus, the other article transport vehicles are prohibited from traveling through the second path from the third path via the connecting portion, and therefore, contact between the article transport vehicles is avoided on the second path side of the connecting portion (P3), for example.

SUMMARY OF THE INVENTION

Article transport vehicles do not only simply pass through the management zone but may also stop in the management zone. For example, a transport source and a transport destination of articles transported by the article transport vehicles are installed in the management zone, an article transport vehicle may stop in the management zone to deliver the articles. If an article transport vehicle is present in the management zone, other article transport vehicles cannot enter the management zone. If an article transport facility that has first entered the management zone is stopped in the management zone, exclusive control performed by the zone controller (30) elongates the time to restrict passage of the other article transport vehicles, resulting in a decrease in transport efficiency in the article transport facility.

In view of the foregoing background, there is a desire for provision of a technique for further improving the transport efficiency of article transport vehicles in an article transport facility in which the article transport vehicles may stop in the management zone.

In view of the above, an article transport facility includes: a travel path for an article transport vehicle for transporting an article, the travel path including a first path having an end portion connected to a connecting portion, a second path having an end portion connected to the connecting portion, and a third path having an end portion connected to the connecting portion, wherein a region including at least a portion of the first path, at least a portion of the second path, at least a portion of the third path, and the connecting portion is set as a management zone in which passage of the article transport vehicle is managed; and a control device configured to perform control to manage the passage of the article transport vehicle in the management zone, wherein a station at which the article transport vehicle stops is provided in the management zone, the station is provided in the first path in the management zone, at a position at which the article transport vehicle stopped at the station does not interfere with another article transport vehicle that travels through the second path and the third path, and the control device can execute basic processing for permitting a first article transport vehicle, which is the article transport vehicle that first enters the management zone, to enter the management zone if no article transport vehicle is present in the management zone, and prohibiting a second article transport vehicle, which is another article transport vehicle, from entering the management zone if the first article transport vehicle is present in the management zone, and first exception processing for permitting the second article transport vehicle to enter the management zone in a case where, even if the first article transport vehicle is present in the management zone, the first article transport vehicle is the article transport vehicle that stops at the station, and the second article transport vehicle passes through the second path and the third path but does not pass through the first path.

According to this configuration, since exclusive control is executed such that only one article transport vehicle can enter the management zone due to the basic processing, interference between a plurality of article transport vehicles in the management zone can be appropriately prevented. Further, the second article transport vehicle is allowed to enter the management zone by the first exception processing even if the first article transport vehicle is present in the management zone. With only the basic processing, the second article transport facility needs to wait to enter the management zone until the first article transport vehicle that stops in the management zone exits the management zone, which prevents improvement of the transport efficiency in the article transport facility. However, according to this configuration, even if the first article transport vehicle is stopped in the management zone, the second article transport vehicle can pass through the management zone if the second article transport vehicle does not interfere with the first article transport vehicle in the management zone, and therefore the transport efficiency in the article transport facility can be improved. That is to say, according to this configuration, the transport efficiency of the article transport vehicles can be further improved in the article transport facility in which the article transport vehicles may stop in the management zone.

Further features and advantages of the article transport facility will become apparent from the following description of exemplary and non-limiting embodiments described with reference to the drawings.

DETAILED DESCRIPTION OF PREFERRED EMBODIMENTS

Figure 1:
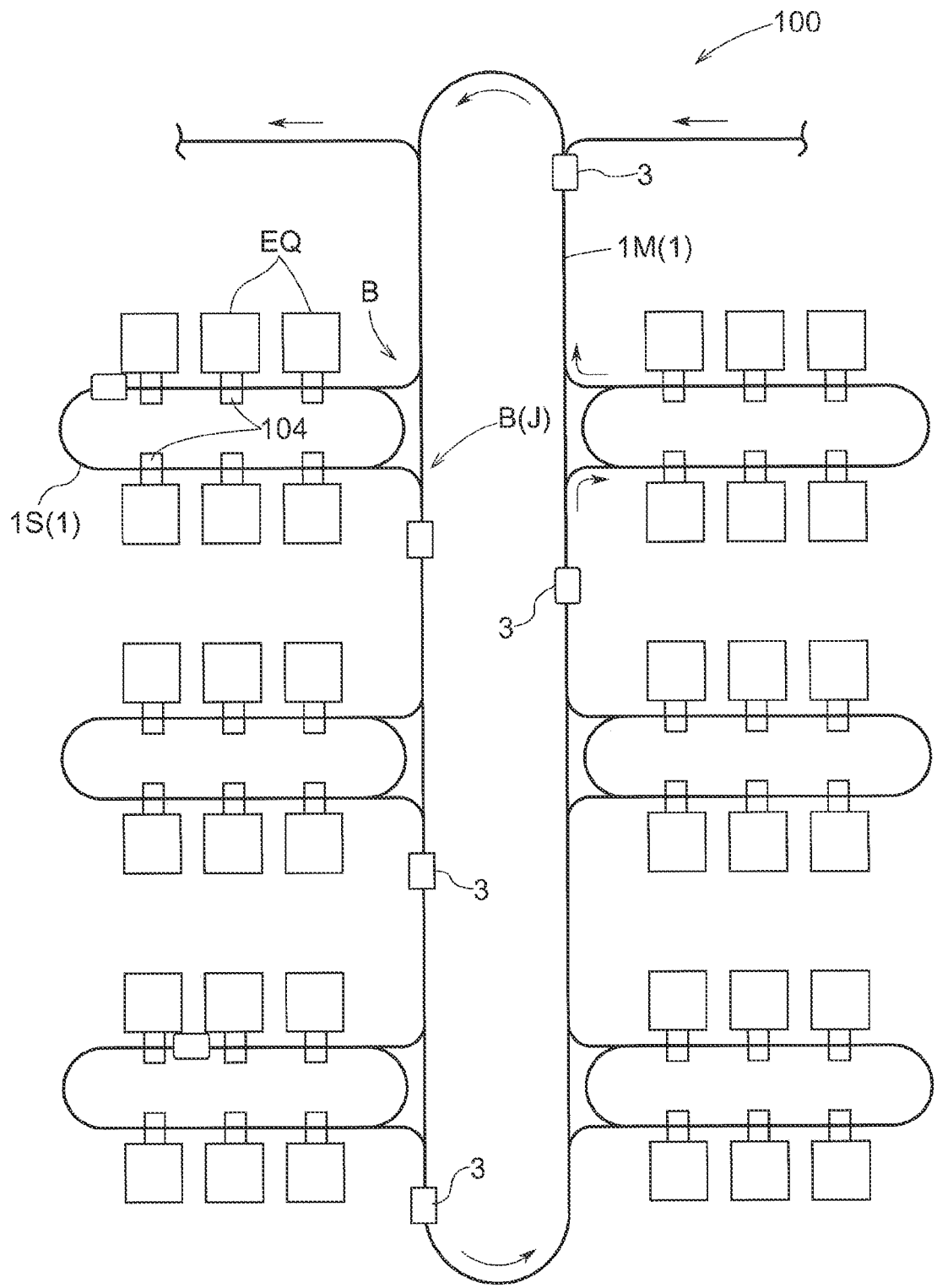
FIG. 1 is a plan view of an article transport facility.

Hereinafter, embodiments of the article transport facility will be described with reference to the drawings. As shown in FIGS. 1 to 5, an article transport facility 100 includes travel rails 2, which are suspended from and supported by a ceiling 101 and installed along a travel path 1, and article transport vehicles 3 (VHL), which travel on the travel rails 2 along the travel path 1 and transport articles W. In the following description, a direction parallel to the travel path 1 is referred to as a travel direction Y, and a direction parallel to a horizontal plane and orthogonal to the travel direction Y is referred to as a widthwise direction X. A vertical direction Z is a direction orthogonal to the travel direction Y and the widthwise direction X.

Each article transport vehicle 3 transports an article W, which is, for example, a FOUP (Front Opening Unified Pod) for containing a semiconductor substrate, a reticle for containing a photomask, or the like. In the present embodiment, a FOUP is described as an example of the article W. Note that each article W also includes a photomask, a semiconductor substrate, or the like, which are an item contained in the article W. The article transport facility 100 is also equipped with a plurality of processing devices EQ for performing various types of processing on the photomask, the semiconductor substrate, or the like, or for performing various types of processing using the photomask, the semiconductor substrate, or the like.

As shown in FIG. 1, the travel path 1 includes one primary path 1M having a loop shape, a plurality of secondary paths 1S each having a loop shape and passing through the plurality of processing devices EQ, and branching and merging portions B that connect the primary path 1M and the secondary paths 1S. The branching and merging portions B include a branching portion (e.g., see B4 in FIG. 9) that branches from the primary path 1M toward a secondary path 1S, and a merging portion (e.g., see B1 in FIG. 9) at which a connecting path extending from a secondary path 1S to the primary path 1M merges with the primary path 1M. Further, the branching and merging portions B include a branching portion (e.g., see B3 in FIG. 9) that branches from a loop secondary path 1S to a connecting path to the primary path 1M, and a merging portion (e.g., see B2 in FIG. 9) at which a loop secondary path 1S merges with a connecting path extending from the primary path 1M to the secondary path 1S. Note that, in the following description, there are cases where the merging portions (B1 and B2), out of the branching and merging portions B, are distinguished and referred to as "connecting portions J". In the present embodiment, the travel path 1 is a one-way path, and each article transport vehicle 3 travels through the travel path 1 from the upstream side in the travel direction toward the downstream side in the travel direction, as indicated by arrows in FIG. 1 and other relevant diagrams.

Figure 2:
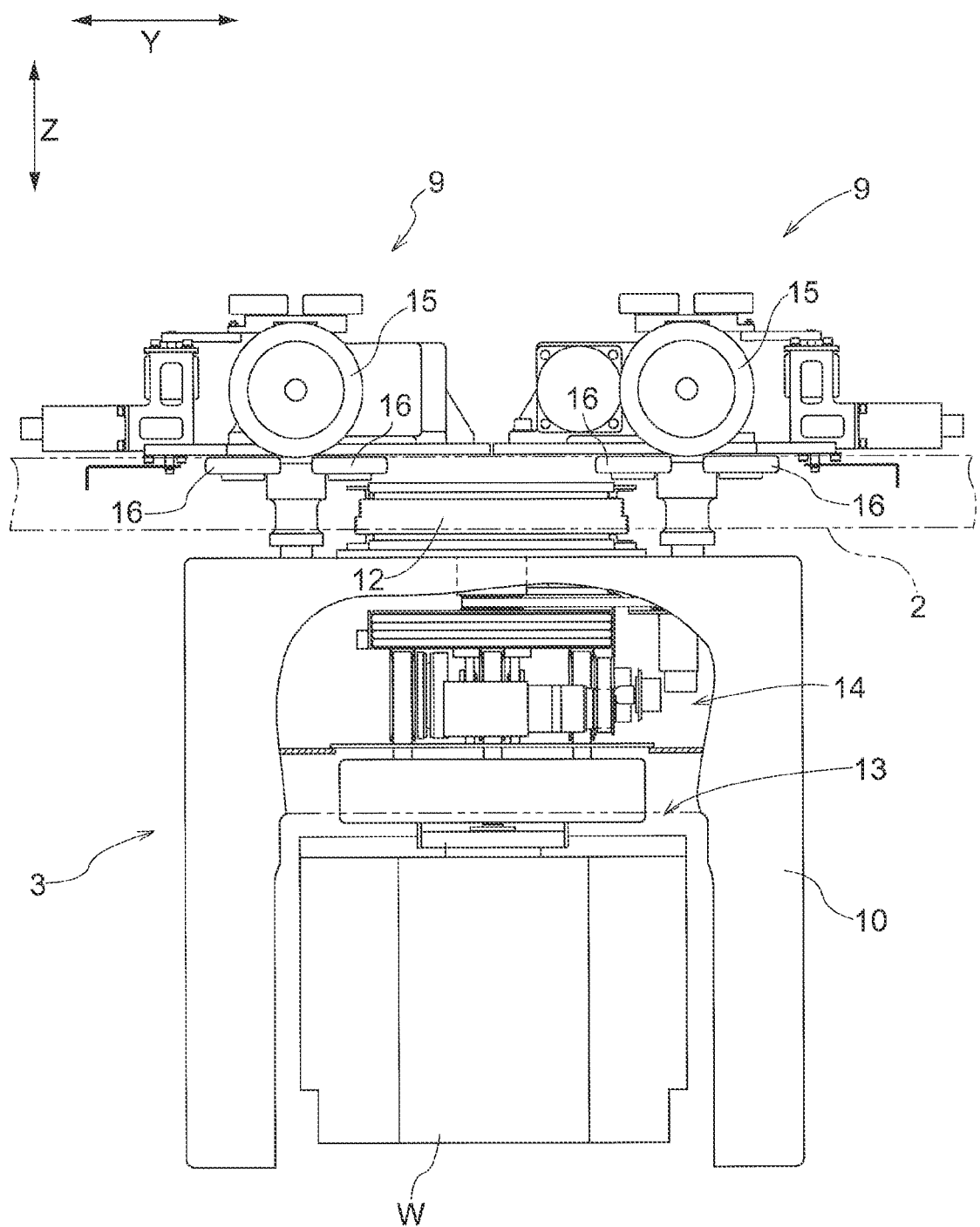
FIG. 2 is a side view of the article transport vehicle.
Figure 3:
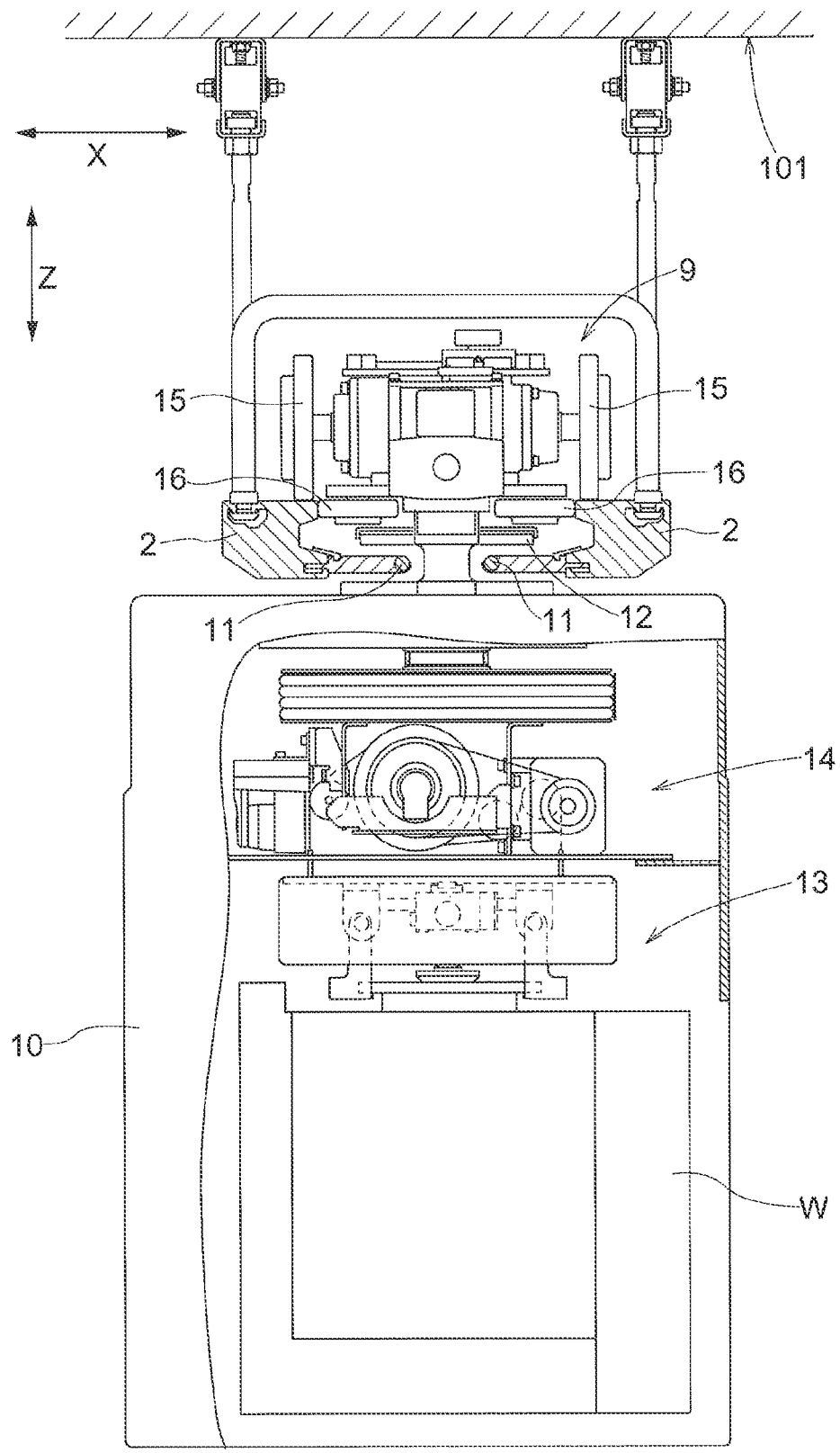
FIG. 3 is a front view of the article transport vehicle.

As shown in FIGS. 2 and 3, each article transport vehicle 3 includes travel units 9 that travel along the travel path 1 while being guided by a pair of travel rails 2, which are arranged while being suspended from and supported by the ceiling 101 along the travel path 1, a transport vehicle body 10 that is located below the travel rails 2 and suspended from and supported by the travel units 9, and a power receiving unit 12 that contactlessly receives driving power from feeder lines 11 laid along the travel path 1. The transport vehicle body 10 is equipped with an article holding unit 13 for suspending holding an article W in a suspended manner, and a lift unit 14 for raising and lowering the article holding unit 13. As shown in FIGS. 2 and 3, the article transport vehicle 3 travels with the article holding unit 13 raised and transports the article W.

Figure 4:
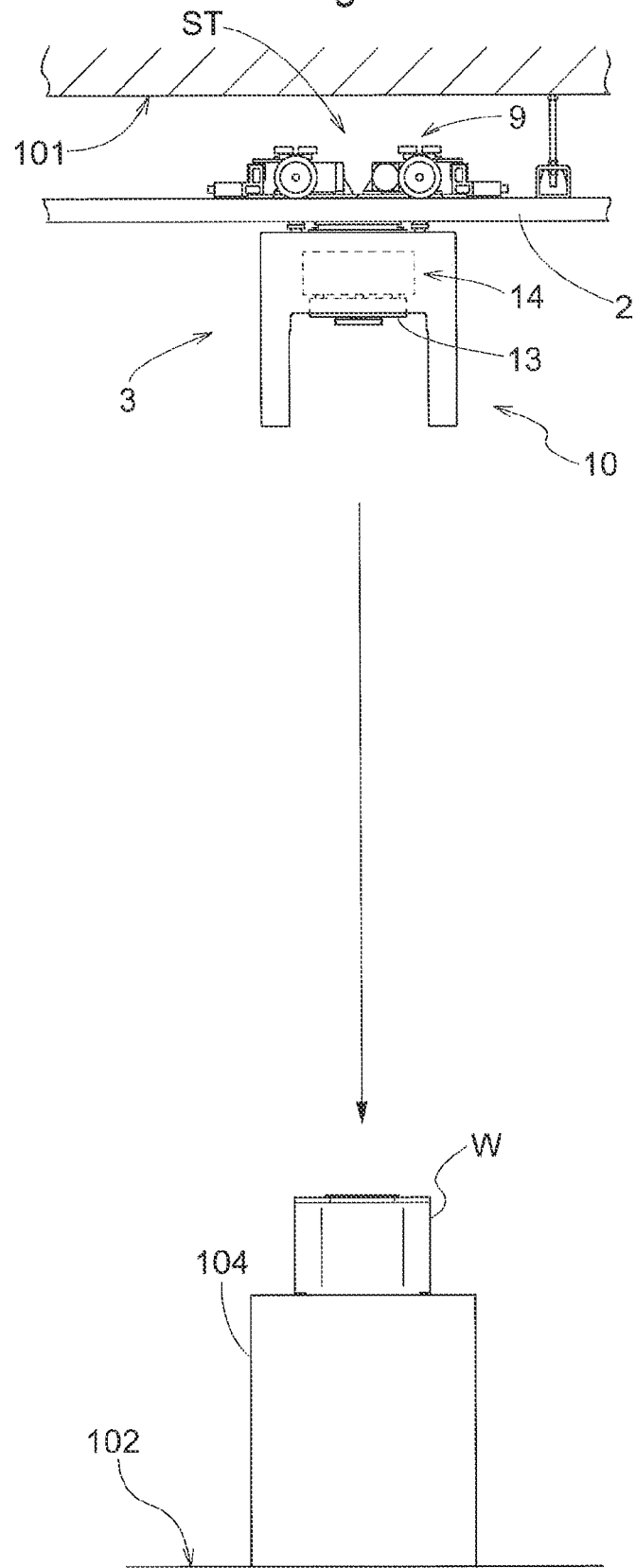
FIG. 4 is a diagram showing an example where an article is transferred by an article transport vehicle.

As shown in FIG. 4, the article transport facility 100 includes mounting platforms 104 that are installed on a floor side 102 and on which the articles W are placed. Each article transport vehicle 3 transfers the article W to and from a mounting platform 104 with the article holding unit 13 lowered. The mounting platforms 104 are arranged in a plurality of areas in the article transport facility 100. For example, the mounting platforms 104 are arranged at the processing devices EQ or in an article storage (not shown in FIG. 1). A location at which each mounting platform 104 is installed and an article transport vehicle 3 stops in the travel path 1 is referred to as a station ST.

In the present embodiment, one article transport vehicle 3 has two travel units 9, and a common transport vehicle body 10 is suspended from and supported by these travel units 9, as shown in FIG. 3. The two travel units 9 have the same configuration, and each travel unit 9 is equipped with the power receiving unit 12, for example. The travel units 9 are arranged side-by-side in the travel direction Y of the article transport vehicle 3.

Figure 5:
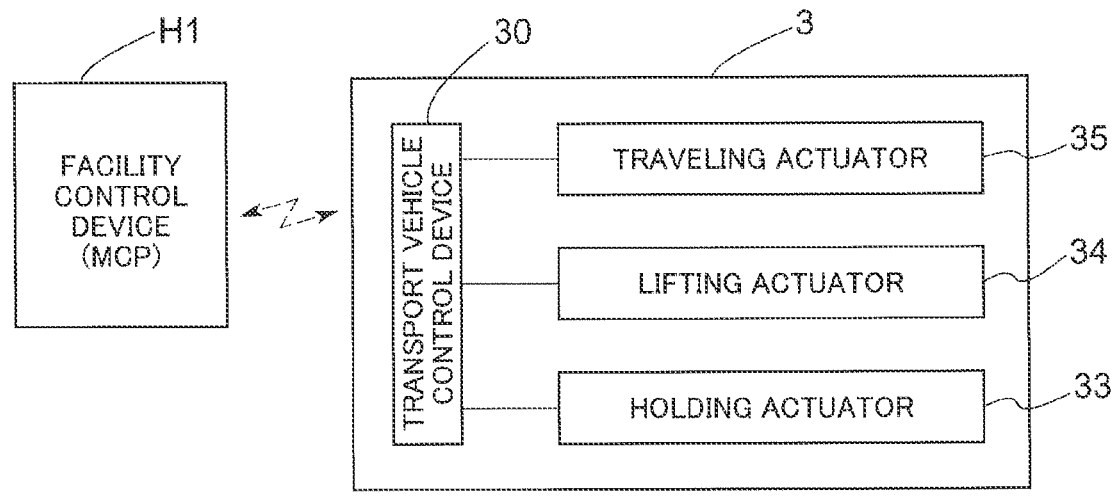
FIG. 5 is a schematic block diagram showing an example of a system configuration of the article transport facility.

As shown in FIGS. 2 and 3, each travel unit 9 has a pair of travel wheels 15, which are driven to rotate by an electric traveling actuator 35 (see FIG. 5). The travel wheels 15 roll on traveling surfaces formed by the upper surfaces of the travel rails 2. Each travel unit 9 is also equipped with a pair of guide wheels 16, which freely rotate about respective axes parallel to the vertical direction Z (i.e., about respective vertical axes), in contact with the inner surfaces of the pair of travel rails 2. As shown in FIG. 5, each transport vehicle body 10 has actuators such as a lifting actuator 34 for raising and lowering the article holding unit 13 and a holding actuator 33 for driving the article holding unit 13 that holds the article W by gripping the article W, a drive circuit for driving these actuators, and so on. Note that these actuators are, for example, motors, solenoids, or the like.

Each article transport vehicle 3 transports the article W between different mounting platforms 104, based on a transport instruction from a facility control device H1 (MCP: Material Control Processor) for managing the entire article transport facility 100. In the present embodiment, the facility control device H1 and the article transport vehicles 3 are configured to be able to communicate with each other by means of wireless communication. Each article transport vehicle 3 has a transport vehicle control device 30, which causes the article transport vehicle 3 to travel under autonomous control based on a transport instruction, stop at a station ST that is set above a designated mounting platform 104, and transfer the article W by raising and lowering the article holding unit 13.

Note that, as mentioned above, the travel path 1 includes a plurality of branching and merging portions B, in each of which one path branches into a plurality of paths, or a plurality of paths merge into one path. For example, when an article transport vehicle 3 branches at a branching portion, if another article transport vehicle 3 is present in either of the two branch paths, there is a possibility that the article transport vehicle 3 will come into contact with the other article transport vehicle 3 before or after passing through the branching portion. Further, when an article transport vehicle 3 merges at a merging portion, if another article transport vehicle 3 is present in either of two paths before merge with each other, there is a possibility that the article transport vehicle 3 will come into contact with the other article transport vehicle 3 before or after passing through the merging portion. That is to say, there is a possibility that a plurality of article transport vehicles 3 interfere with each other at the branching and merging portions B.

Figure 6:
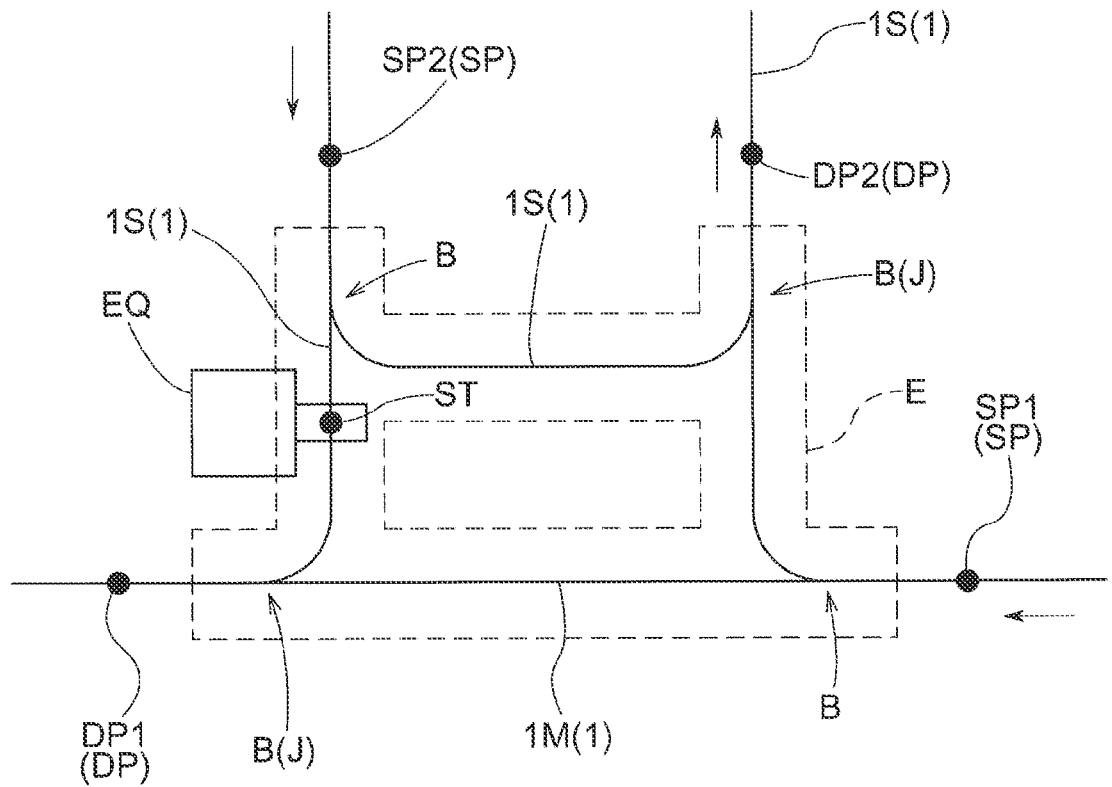
FIG. 6 is a diagram showing an example of a management zone in which a station is arranged.
Figure 7:
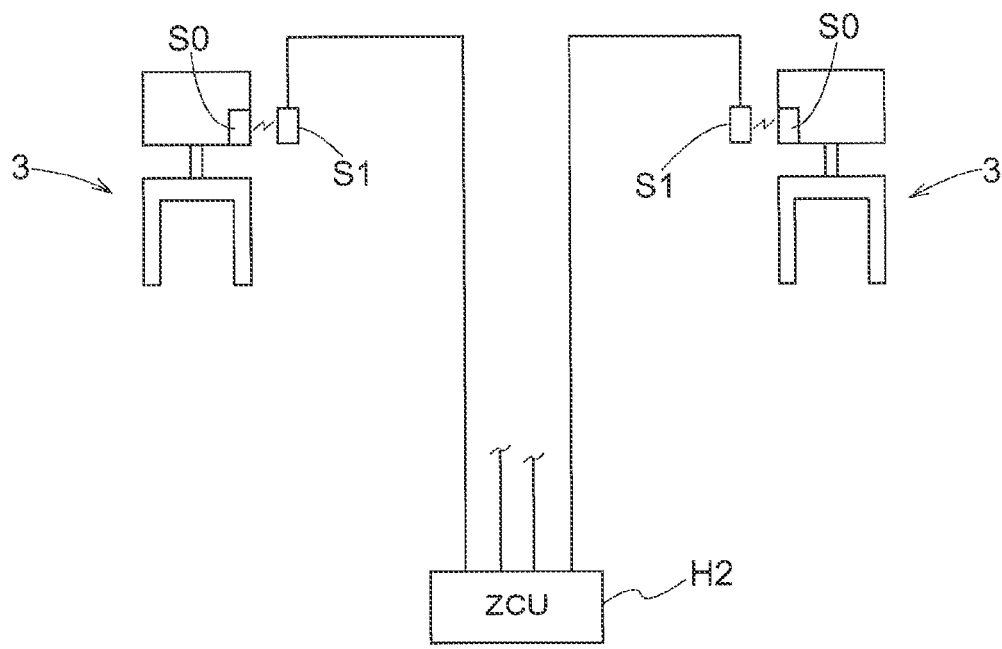
FIG. 7 is a diagram showing an example mode of communication between the article transport vehicle and a zone management device.

To avoid such interference and adjust the passage of the article transport vehicles 3 at each branching and merging portion B, a management zone E in which the passage of the article transport vehicles 3 is managed is set in a region including the branching and merging portion B in the travel path 1, as shown in FIG. 6. Further, the article transport facility 100 includes a zone management device H2 (ZCU: Zone Control Unit), as shown in FIG. 7. A plurality of management zones E are set in the travel path 1, and the zone management device H2 is provided in each of the management zones E. That is to say, the management zones E are set in regions where the passage of a plurality of article transport vehicles 3 needs to be adjusted, such as the branching and merging portions B in the travel path 1, and the plurality of zone management devices H2 manage the passage of the article transport vehicles 3 in the respective management zones E independently of each other. Each zone management device H2 corresponds to a control device that controls management of the passage of the article transport vehicles 3 in the corresponding management zone E.

In the present embodiment, path-side communication units S1 are arranged along the travel path 1 in order to detect the article transport vehicles 3 that enter and exit the management zones E. In the example shown in FIG. 6, entry detection points SP (a first entry detection point SP1 and a second entry detection point SP2) are provided on the upstream side in the travel direction relative to the management zone E in order to detect the article transport vehicles 3 that enter the corresponding management zone E, before the article transport vehicle 3 enters the management zone E. Further, exit detection points DP (a first exit detection point DP1 and a second exit detection point DP2) are provided on the downstream side in the travel direction relative to the management zone E in order to detect the article transport vehicles 3 that exit the management zone E, after the article transport vehicles 3 have exited the management zone E. The path-side communication units S1 are arranged at the entry detection points SP and the exit detection points SP, or at least at the entry detection points SP.

Each article transport vehicle 3 is equipped with a transport vehicle-side communication unit S0 capable of bidirectional communication with the path-side communication units S1 by means of optical communication, for example. If an article transport vehicle 3 temporarily stops at an entry detection point SP, the zone management device H2 detects the article transport vehicle 3 that enters the management zone E, based on the communication between the transport vehicle-side communication unit S0 and the path-side communication unit S1. For example, an "arrival-at-entry detection point" signal and an "entry request" signal are transmitted from the article transport vehicle 3 to the zone management device H2. A "transport vehicle (VHL) detection" signal is transmitted from the zone management device H2 to the article transport vehicle 3, and the article transport vehicle 3 is notified that the presence of the article transport vehicle 3 waiting to enter the management zone E has been recognized. If the zone management device H2 permits the entry into the management zone E, entry permission information is transmitted to the transport vehicle-side communication unit S0 via the path-side communication unit S1. For example, a "passage permission" signal is transmitted from the zone management device H2 to the article transport vehicle 3. Note that if, for example, the article transport vehicle 3 stops at a station ST in the management zone E after entering the management zone E, it is preferable to also transmit, at the entry detection point SP, information indicating that the article transport vehicle 3 is scheduled to stop to the zone management device H2.

Thus, the zone management device H2 manages the passage of the plurality of article transport vehicles 3, including this article transport vehicle 3, in the management zone. When a plurality of article transport vehicles 3 are about to enter the management zone E, the zone management device H2 performs adjustment and control such that only one article transport vehicle 3 is present in the management zone E. That is to say, the zone management device H2 executes "basic processing", which is processing for permit an article transport vehicle (which is, here, a first article transport vehicle 31 (see FIG. 9 etc.)) that enters the management zone E first to enter the management zone E if no article transport vehicle 3 is present in the management zone E, and prohibiting another article transport vehicle 3 (which is, here, a second article transport vehicle 32 (see FIG. 9)) from entering the management zone E if the first article transport vehicle 31 is present in the management zone E.

Thereafter, after an article transport vehicle 3 that passed through the management zone E has passed through the exit detection point DP, the zone management device H2 detects that this article transport vehicle 3 has exited the management zone E. The exit may be detected by means of communication (e.g., optical communication) between the path-side communication unit S1 and the transport vehicle-side communication unit S0 at the exit detection point DP, as with the entry detection point SP, or may be detected by another sensor or the like that is installed at the exit detection point DP. The article transport vehicle 3 does not need to temporarily stop at the exit detection point DP.

In the present embodiment, a station ST at which an article transport vehicle 3 stops is provided in the management zone E, as shown in FIG. 6. As mentioned above with reference to FIG. 4, an article transport vehicle 3 stops and transfers the article W to or from the mounting platform 104 at the station ST. That is to say, there are cases where an article transport vehicle 3 is present that stays in the management zone E for a longer time than an article transport vehicle 3 that simply passes through the management zone E. Since the station ST is arranged in the secondary path 1S as shown in FIG. 6, an article transport vehicle can pass through the management zone E via the primary path 1M even if this primary path 1M is included in the same management zone E. That is to say, even if an article transport vehicle 3 stopped at the station ST is present, another article transport vehicle 3 can pass through the management zone E if the other article transport vehicle 3 passes through a path that does not interfere with the stopped article transport vehicle 3.

However, in the aforementioned "basic processing", if an article transport vehicle 3 (the first article transport vehicle 31) is present in the management zone E, another article transport vehicle 3 (the second article transport vehicle 32) is prohibited from entering the management zone E. The second article transport vehicle 32 needs to wait for a longer time than in the case where the first article transport vehicle 31 is an article transport facility 3 that simply passes through the management zone E, and transport efficiency in the article transport facility 100 will decrease. For this reason, it is preferable that the second article transport vehicle 32 can pass through the management zone E under certain conditions even if an article transport vehicle 3 (the first article transport vehicle 31) is present in the management zone E.

Figure 9:
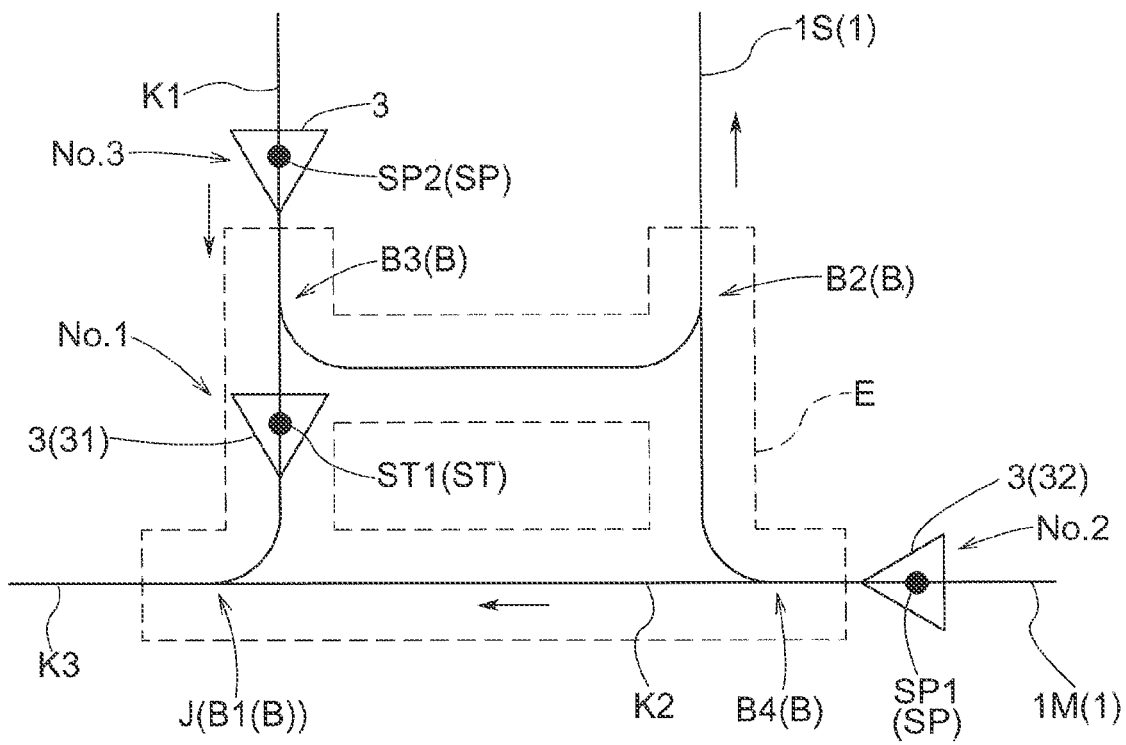
FIG. 9 is a diagram showing an example of adjusting article transport vehicles that pass through the management zone.

As these conditions, it is required that the first article transport vehicle 31 stops (more reliably, is stopped) at the station ST, and that the second article transport vehicle 32 that passes through the management zone E does not interfere with that article transport vehicle 3 (the first article transport vehicle 31 that is present in the path from the entrance of the management zone E to the station ST, or at least the first article transport vehicle 31 stopped at the station ST). Interference between the first article transport vehicle 31 and the second article transport vehicle 32 is defined by the configuration of the travel path 1 in the management zone E and the position of the station ST in the travel path 1. The present embodiment describes as an example a configuration in which, in the case where the travel path 1 includes a first path K1 having an end portion connected to a connecting portion J, a second path K2 having an end portion connected to the connecting portion J, and a third path K3 having an end portion connected to the connecting portion J, and a region including at least a portion of the first path K1, at least a portion of the second path K2, at least a portion of the third path K3, and the connecting portion J is set as the management zone E as shown in FIG. 9, for example, the station ST is provided in the first path K1 in the management zone E at a position at which an article transport vehicle 3 stopped at this station ST does not interfere with other article transport vehicles 3 traveling through the second path K2 and the third path K3.

The zone management device H2 executes the following "exception processing (first exception processing)" when the travel path 1 in the management zone E is in the above mode. That is to say, even if, as shown in FIG. 9, the first article transport vehicle 31 is present in the management zone E, the first exception processing for permitting the second article transport vehicle 32 to enter the management zone E is executed if the first article transport vehicle 31 is stopped at the station ST and the second article transport vehicle 32 passes through the second path K2 and the third path K3 but does not pass through the first path K1.

Figure 8:
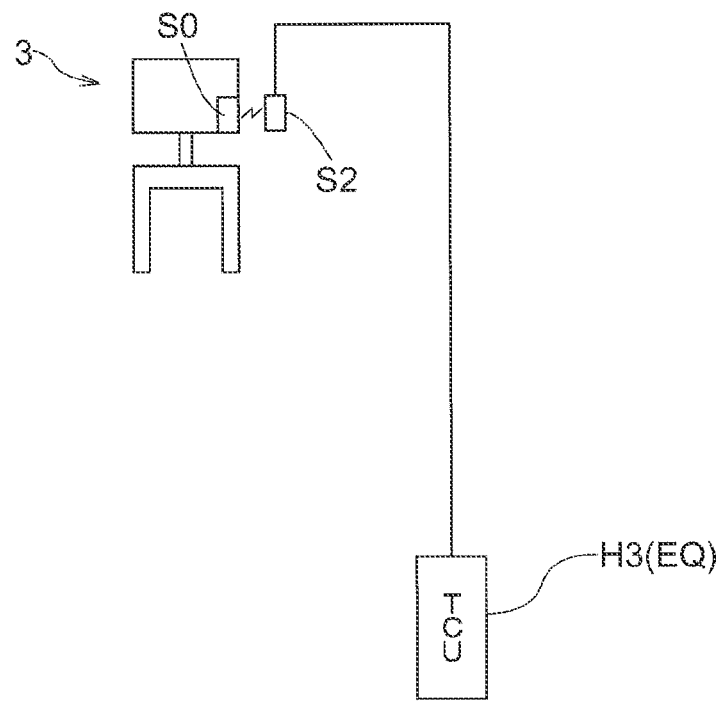
FIG. 8 is a diagram showing an example mode of communication between the article transport vehicle and a transfer management device.

For detection of the first article transport vehicle 31 being stopped at the station ST, it is conceivable to perform the detection by means of communication between the path-side communication unit S1 provided at the station ST and the transport vehicle-side communication unit S0, similarly to the communication between the path-side communication unit S1 and the transport vehicle-side communication unit S0 performed at the entry detection point SP, for example. However, at the station ST, information regarding transfer to/from the mounting platform 104 needs to be communicated between the article transport vehicle 3 and a transfer control device H3 (TCU: Transfer Control Unit) in the processing device EQ. For example, at the station ST, a device-side communication unit S2 communicates with the transport vehicle-side communication unit S0 as shown in FIG. 8. For this reason, it is difficult to install, at the station ST, the path-side communication unit S1 for transmitting information to the zone management device H2, and it is difficult for the zone management device H2 to obtain information that the first article transport vehicle 31 is stopped at the station ST. In the present embodiment, the zone management device H2 communicates with the transport vehicle control device 30 using a signal that is not used in the communication between the transfer control device H3 in the processing device EQ and the transport vehicle control device 30 of the article transport vehicle 3.

Figure 10:
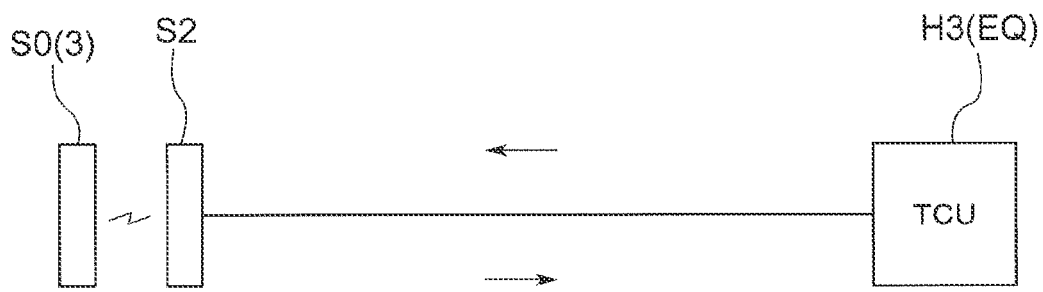
FIG. 10 is a diagram showing an example of communication data sent between the article transport vehicle and the transfer management device.

FIG. 10 shows an example of a mode of communication between the transfer control device H3 in the processing device EQ and the transport vehicle control device 30 of the article transport vehicle 3. Communication between the device-side communication unit S2 and the transfer control device H3 may be carried out by means of serial communication using an RJ11 (modular jack) communication line or the like, or may be carried out by means of parallel communication such as PIO (Parallel Input/Output). Alternatively, a mode of communication using a wired network connection, such as Ethernet (registered trademark), may be employed.

The article holding unit 13 is raised and lowered during a transfer, as mentioned with reference to FIG. 4. The article transport vehicle 3 communicates with the transfer control device H3 performs communication regarding a request and permission for raising and lowering the article holding unit 13. For example, as shown in FIG. 10, a signal for making a request to raise or lower the article holding unit 13 is transmitted from the article transport vehicle 3 side, and a signal for giving permission to raise and lower the article holding unit 13 is transmitted from the transfer control device H3 side.

Figure 11:
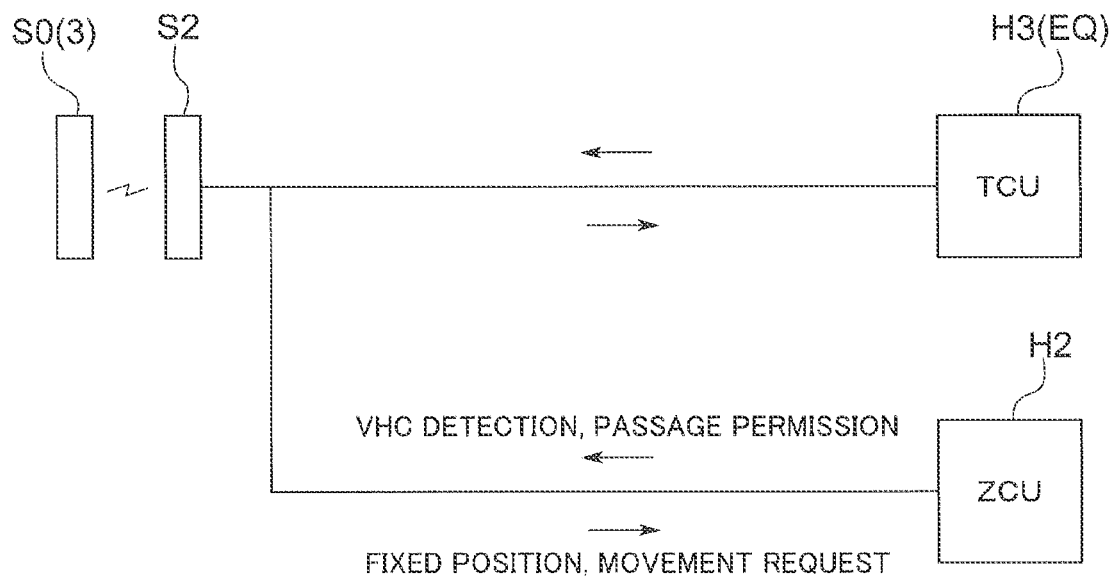
FIG. 11 is a diagram showing an example where communication data sent between the article transport vehicle and the transfer management device is distributed to the zone management device.

FIG. 11 shows an example mode in which the communication path between the transfer control device H3 in the processing device EQ and the transport vehicle control device 30 of the article transport vehicle 3 is branched, and the zone management device H2 also communicates with the transport vehicle control device 30. For example, a "fixed position" signal and a "movement request" signal are transmitted from the article transport vehicle 3 to the zone management device H2, and a "VHL detection" signal and a "passage permission" signal are transmitted from the zone management device H2 to the article transport vehicle 3, as shown in FIG. 11.

The "fixed position" signal corresponds to the "arrival-at-entry detection point" signal in the aforementioned "basic processing", the "movement request" signal corresponds to the "entry request" signal in the "basic processing", and the "VHL detection" signal and the "passage permission" signal are the same as those in the "basic processing". That is to say, the article transport vehicle 3 stopped at the station ST is also enabled to communicate with the zone management device H2 by enabling, in the communication between the device-side communication unit S2 and the transport vehicle-side communication unit S0, transmission and reception of signals having the same meaning as those in the communication between the path-side communication unit S1 and the transport vehicle-side communication unit S0.

Note that if the communication between the device-side communication unit S2 and the transfer control device H3 is carried out by means of parallel communication such as PIO, not all signal lines are necessarily used. If there is an unused signal line, the communication between the zone management device H2 and the transport vehicle control device 30 can be enabled through simple modification using an existing facility, by using the unused signal line in the communication between the device-side communication unit S2 on the article transport vehicle 3 side and the zone management device H2.

As mentioned above, the plurality of signals transmitted from the device-side communication unit S2 to the transfer control device H3 are distributed to two paths. Accordingly, it is preferable that parallel signals, such as PIO signals, are used to transmit signals from the device-side communication unit S2 to the transfer control device H3. The distributed signals may be transmitted, as-is, as parallel signals such as PIO signals to the transfer control device H3, or may be converted to serial signals and then transmitted to the transfer control device H3. Similarly, signals to the zone management device H2 may also be transmitted, as-is, as parallel signals such as PIO signals, or may be converted to serial signals and then transmitted. The mode of signals transmitted to the transfer control device H3 and signals transmitted to the zone management device H2 have been described here, but of course, transmission and reception is carried out in the same communication method.

Here, a mode of enabling execution of the "first exception processing" in an existing article transport facility 100 will be described. For example, if, in the existing article transport facility 100, the device-side communication unit S2 is of a serial signal output type, and the device-side communication unit S2 and the transfer control device H3 are connected by a serial communication line, the device-side communication unit S2 is changed to that of a parallel signal output type. After distributing the signals as mentioned above, the zone management device H2 is connected by a parallel signal line as-is. A parallel-serial converter is added to the transfer control device H3, and the transfer control device H3 and the parallel-serial converter are connected by the same serial signal line as that of the existing article transport facility 100. Thus, the article transport vehicles 3 that stop at the station ST can be added to items to be managed by the zone management device H2 by simply changing or adding devices.

As described above, the passage of a plurality of article transport vehicles 3, including an article transport vehicle 3 stopped at the station ST, in the management zone E can be managed by the zone management device H2 as a result of unused bits in communication data transmitted between the device-side communication unit S2 and the transfer control device H3 being used in the communication between the zone management device H2 and the article transport vehicles 3. That is to say, the zone management device H2 detects a stop and a start of an article transport vehicle 3 at the station ST and manages the passage of a plurality of article transport vehicles 3 including this article transport vehicle 3 in the management zone E, based on the communication between the device-side communication unit S2 provided at the station ST and the transport vehicle-side communication unit S0 provided in the article transport vehicle 3.

Figure 12:
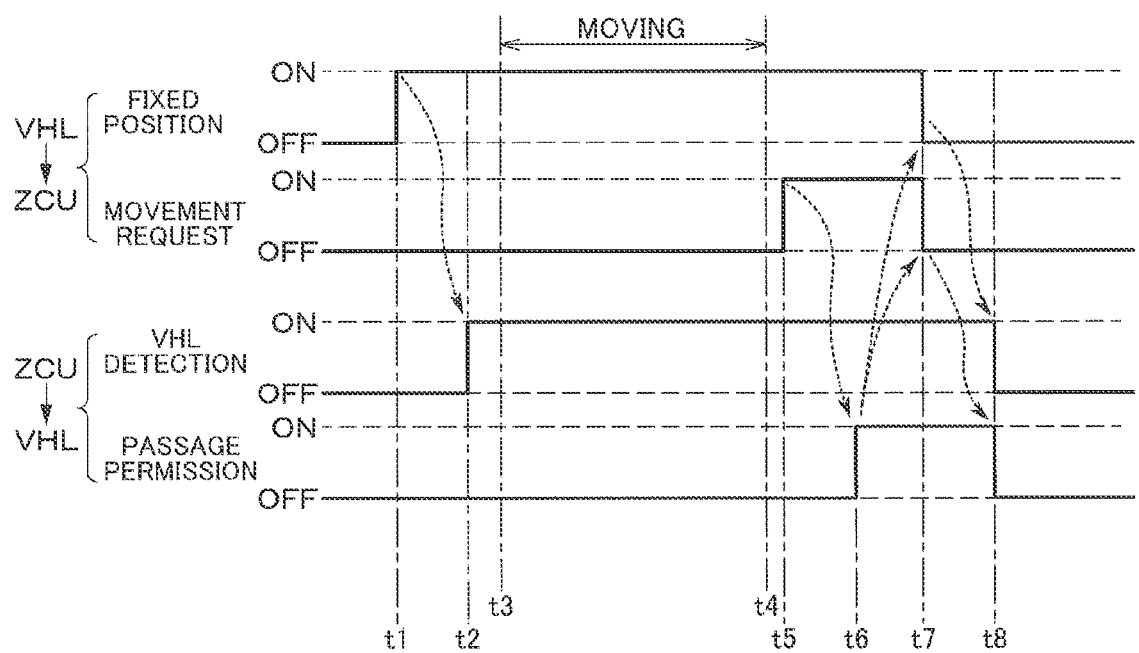
FIG. 12 is a timing chart showing an example of communication between the article transport vehicle stopped at the station and the zone management device.

The timing chart in FIG. 12 shows an example of communication between an article transport vehicle 3 that stops at the station ST and the zone management device H2. If the article transport vehicle 3 (the first article transport vehicle 31) arrives at the station ST and stops as shown in FIG. 9, the "fixed position" signal turns ON at a time t1. That is to say, the "fixed position" signal is transmitted from the article transport vehicle 3 (VHL) to the zone management device H2 (ZCU). After checking that the "fixed position" signal is ON, the zone management device H2 turns ON the "VHL detection" signal at a time t2. Thus, the "VHL detection" signal is transmitted from the zone management device H2 to the first article transport vehicle 31. Since the "VHL detection" signal is ON, the first article transport vehicle 31 can check that the first article transport vehicle 31 is to be managed in the zone management device H2. The first article transport vehicle 31 also transfers the article W to or from the mounting platform 104 from a time t3 to a time t4.

Here, when the second article transport vehicle 32 arrives at the first entry detection point SP1 as shown in FIG. 9, the "arrival-at-entry detection point" signal and the "entry request" signal are transmitted from the second article transport vehicle 32 to the zone management device H2. The zone management device H2 has detected that the first article transport vehicle 31 that has entered the management zone E before is stopped at the station ST. In this example, the first path K1 is a one-way path, and the second article transport vehicle 32 in the second path K2 does not pass through the first path K1. Thus, the zone management device H2 transmits the "passage permission" signal to the second article transport vehicle 32. As a result, the second article transport vehicle 32 can pass through the management zone E even if the first article transport vehicle 31 is present in the management zone E. For example, the second article transport vehicle 32 can pass through the management zone E without waiting during the time (from the time t3 to the time t4) when the first article transport vehicle 31 is transferring the article W, and therefore, the transport efficiency in the article transport facility 100 can be improved.

After completing the transfer of the article W, the first article transport vehicle 31 transmits the "movement request" signal to the zone management device H2. If the second article transport vehicle 32 is present in the management zone E when the zone management device H2 receives the "movement request" signal, the zone management device H2 does not immediately transmit the "passage permission" signal but waits as-is. That is to say, the zone management device H2 executes second exception processing for prohibiting the first article transport vehicle 31 from starting from the station ST until the second article transport vehicle 32, after entering the management zone E due to the first exception processing, exits from the management zone E.

When the second article transport vehicle 32 exits the management zone E, information that the second article transport vehicle 32 has exited the management zone E is transmitted from the first exit detection point DP1 (see FIG. 6) to the zone management device H2. After the zone management device H2 has checked that the second article transport vehicle 32 has exited the management zone E, the zone management device H2 transmits the "passage permission" signal to the first article transport vehicle 31 (time t6).

The first article transport vehicle 31 that has received the "passage permission" signal checks that the first article transport vehicle 31 has permitted to move, based on the "VHL detection" signal being ON and the "passage permission" signal being ON, and restores the "fixed position" signal the "movement request" signal to OFF (time t7). The first article transport vehicle 31 starts moving due to being permitted to move. Since the "fixed position" signal and the "movement request" signals have turned OFF, the zone management device H2 restores the "VHL detection" signal and the "passage permission" signal to OFF (time t8).

There are cases where a plurality of article transport vehicles 3 make requests to enter the management zone E at the same time. In principle, the zone management device H2 generates a queue in which a higher priority of entry is given in the order of arriving at the management zone E, i.e., in the order of receiving the "entry request" signal transmitted to the zone management device H2 at the entry detection point SP. The zone management device H2 then transmits the "passage permission" signal to the article transport vehicles 3 in the priority order in the queue. Such management based on the queue is included in the "basic processing".

For example, the case will be considered where a third vehicle (No. 3) and a second vehicle (No. 2), out of the article transport vehicles 3, arrive at the entry detection point SP in this order when a first vehicle (No. 1) is present in the management zone E in the example shown in FIG. 9. Note that, here, the first vehicle is traveling without stopping at the station ST (or has finished a transfer at the station ST and started moving). The zone management device H2 generates a queue while giving a first priority to the third vehicle and a second priority to the second vehicle. When the first vehicle exits the management zone E, the zone management device H2 transmits the "passage permission" signal to the third vehicle, which is given the first priority.

Next, the case is considered where the first vehicle is stopped at the station ST (the case where the first vehicle is moving, or has not finished a transfer or started). The third vehicle is an article transport vehicle 3 that passes through the first path K1, and the second vehicle is an article transport vehicle 3 that passes through the second path K2 and the third path K3 but does not pass through the first path K1. The zone management device H2 permits the second vehicle to enter the management zone E and causes the second vehicle to pass through the management zone E while the first vehicle is stopped at the station ST. This is the "first exception processing".

If the first vehicle has finished a transfer at the station ST and started moving, the zone management device H2 permits the third vehicle to enter the management zone E and causes the third vehicle to pass through the management zone E after the first vehicle has exited from the management zone E according to the priority order in the queue, as mentioned above. Of course, if the second vehicle arrives at the entry detection point SP earlier than the third vehicle, the second vehicle has a higher priority in the queue than the priority of the third vehicle, and thus, the zone management device H2 permits the second vehicle to enter the management zone E and causes the second vehicle to pass through the management zone E after the first vehicle has exited from the management zone E (basic processing).

Next, the case is considered where the third vehicle is also an article transport vehicle 3 (a first waiting transport vehicle) that stops at the station ST, and the second vehicle (a second waiting transport vehicle) and the third vehicle (the first waiting transport vehicle) arrive at the entry detection point SP when the first vehicle (the first article transport vehicle 31) is present in the management zone E. The third vehicle is an article transport vehicle 3 that passes through the first path K1, and the second vehicle is an article transport vehicle 3 that passes through the second path K3 and the third path K2 but does not pass through the first path K1. Here, if the first vehicle is stopped at the station ST when the second and third vehicles make requests to enter the management zone E, the zone management device H2 permits the second vehicle (the second waiting transport vehicle) to enter the management zone E and causes the second vehicle to pass through the management zone E regardless of the order in which the second and third vehicles arrive at the entry detection point SP (the first exception processing). That is to say, the second vehicle corresponds to the second article transport vehicle 32 in the first exception processing. Note that if the third and second vehicles arrive at the entry detection point SP in this order, it is preferable to change the priority order in the queue when the first exception processing is executed.

On the other hand, if the first vehicle has finished a transfer at the station ST and started moving when the second and third vehicles make requests to enter the management zone E, the zone management device H2 permits the third vehicle (the first waiting transport vehicle) to enter the management zone E after the first vehicle has exited the management zone E regardless of the order in which the second and third vehicles arrive at the entry detection point SP. If the second and third vehicles have arrived at the entry detection point SP in this order, the second vehicle is given a higher priority in the queue than that of the third vehicle. Accordingly, it is preferable that the zone management device H2 changes the priority order in the queue and executes the basic processing. The third vehicle that has entered the management zone E stops at the station ST. The zone management device H2 permits the second vehicle (the second waiting transport vehicle) to enter the management zone E and causes the second vehicle to pass through the management zone E while the third vehicle is stopped at the station ST (first exception processing). In other words, to execute the first exception processing, the zone management device H2 causes the third vehicle to enter the management zone E first even if the priority order in the queue changes.

If the second vehicle is caused to enter the management zone E first after the first vehicle has exited the management zone E, the third vehicle cannot enter the management zone E until the second vehicle exits the management zone E. That is to say, entry of the second and third vehicles into the management zone E is exclusively managed due to the basic processing. However, if the third vehicle is caused to enter the management zone E first after the first vehicle has exited the management zone E, the third vehicle stops at the station ST, and therefore, the first exception processing allows the second vehicle to enter the management zone E even if the third vehicle is present in the management zone E after the stop of the third vehicle. That is to say, since the second and third vehicles can be present at the same time in the management zone E, the transport efficiency in the article transport facility 100 can be improved.

That is to say, if the first article transport vehicle 31 that stops at the station ST is present in the management zone E, and article transport vehicles 3 that are waiting to enter the management zone E, namely the first waiting transport vehicle (the third vehicle (No. 3)) that travels through the first path K1 and stops at the station ST and the second waiting transport vehicle (the second vehicle (No. 2)) that passes through the second path K2 and the third path K3 via the connecting portion J make requests to enter the management zone E, the zone management device H2 manages the passage in the management zone E as follows. If the requests to enter the management zone E are made before the first article transport vehicle 31 is enabled to start from the station ST, the zone management device H2 causes the second waiting transport vehicle (the second vehicle (No. 2)) to enter the management zone E earlier than the first waiting transport vehicle (the third vehicle (No. 3)). Further, if the requests to enter the management zone E are made after the first article transport vehicle 31 is enabled to start from the station ST, the zone management device H2 causes the first waiting transport vehicle (the third vehicle (No. 3)) to enter the management zone E earlier than the second waiting transport vehicle (the second vehicle (No. 2)).

Figure 13:
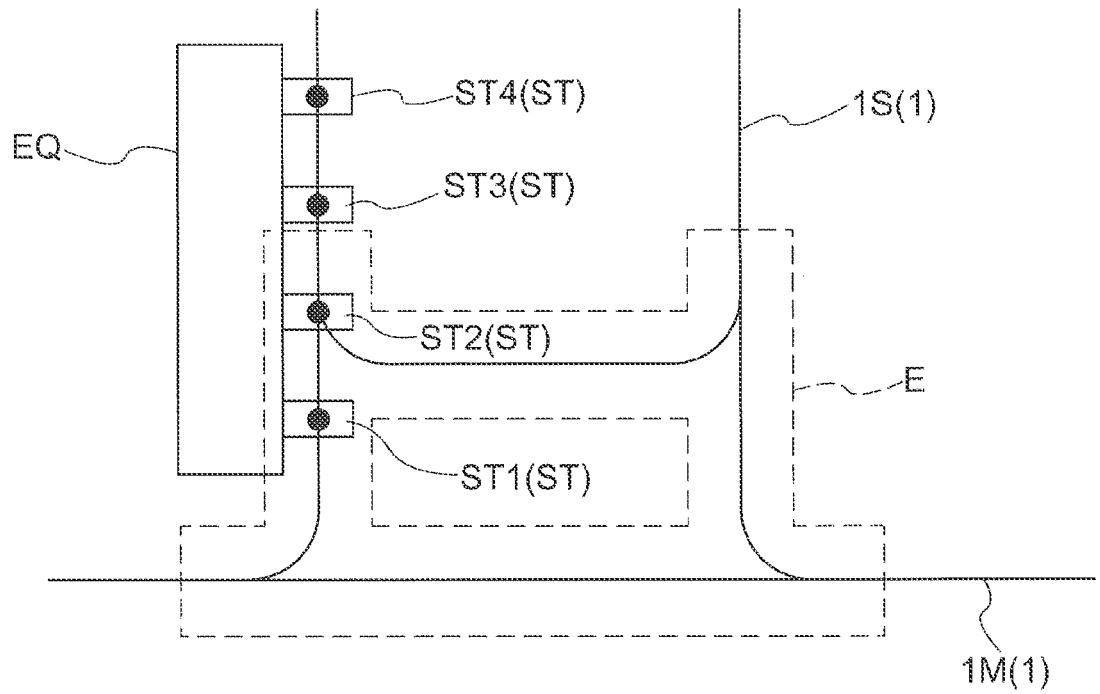
FIG. 13 is a diagram showing an example of the relationship between the management zone and a processing device in which a plurality of stations are set.

As mentioned above, the station ST is set at a position at which the article W to be transported by each article transport vehicle 3 is delivered to and from the processing device EQ (the mounting platform 104) that uses the article W. Although an example mode in which one station ST is provided for one processing device EQ has been described above, a plurality of stations ST may be set for one processing device EQ, as shown as an example in FIG. 13. In this case, some of the stations ST may be installed in the management zone E, and the other stations ST may be installed outside the management zone E. If the stations ST are installed in this manner, some of the plurality of stations ST are in-zone stations (a first station ST1 and a second station ST2) that are located in the management zone E, and the other of the plurality of stations ST are out-of-zone stations (a third station ST3 and a fourth station ST4) that are located outside the management zone E, as shown in FIG. 13. It is preferable that the plurality of stations ST are managed such that the in-zone stations are used less frequently than the out-of-zone stations.

If an article transport vehicle 3 is present in the management zone E, the passage of other article transport vehicles 3 in the management zone E is restricted due to the basic processing, and therefore, there is a possibility that the transport efficiency in the article transport facility 100 will decrease. Moreover, since an article transport vehicle 3 stops at the station ST to transfer the article W, the time during which the article transport vehicle 3 stays in the management zone E becomes longer, and the transport efficiency is likely to decrease. In the present embodiment, such a decrease in the transport efficiency is suppressed by the first exception processing, but the decrease in the transport efficiency can be further suppressed by the above-described management.

Figure 14:
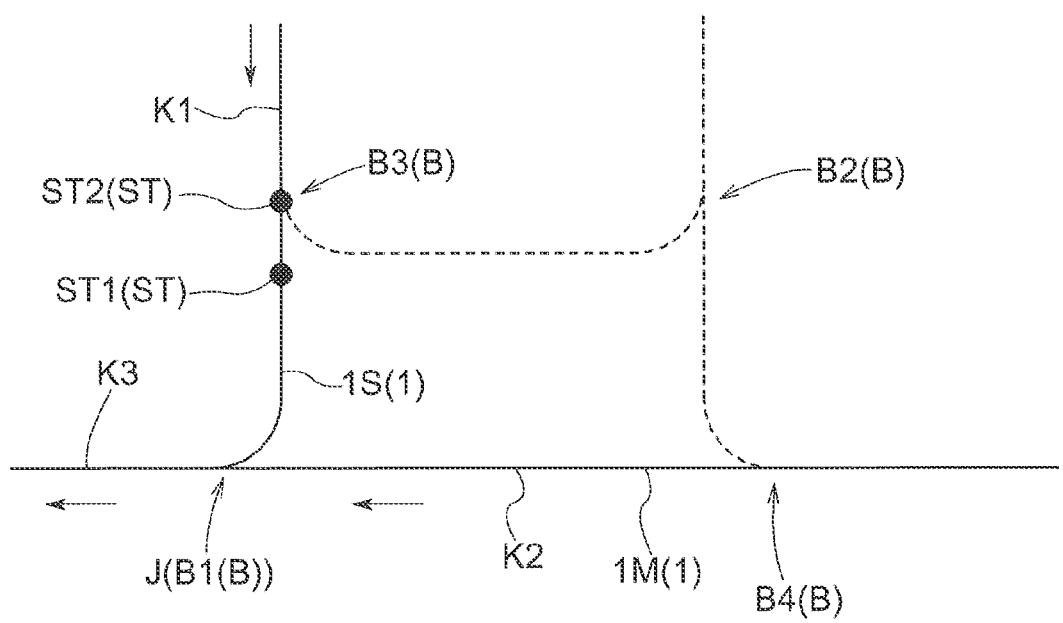
FIG. 14 is a diagram showing an example of a first path, a second path, a third path, and a connecting portion in an area where a primary path and secondary paths are connected.

Note that the above description has been given to an example mode in which the branching and merging portion B (B1) at which the secondary path 1S merges with the primary path 1M is the connecting portion J, the secondary path 1S (connecting path) connected to this connecting portion J is the first path K1, the primary path 1M connected to the connecting portion J on the upstream side in the travel path is the second path K2, and the primary path 1M connected to the connecting portion J on the downstream side in the travel path is the third path K3, as shown in FIG. 9. That is to say, the description has been given to an example mode in which the first path K1, the second path K2, the third path K3, and the connecting portion J are set as indicated by solid lines in FIG. 14. Here, if a plurality of stations ST are present as shown in FIG. 13, the first station ST1 and the second station ST2 are stations ST that are arranged in the first path K1 and at which the first article transport vehicle 31 stops.

Figure 15:
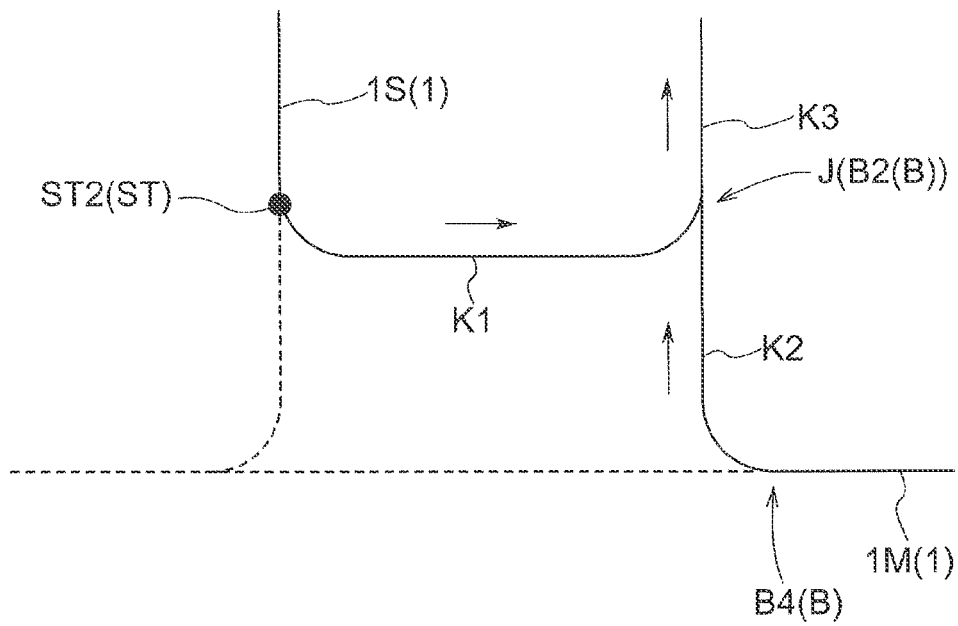
FIG. 15 is a diagram showing another example of the first path, the second path, the third path, and the connecting portion in the area where the primary path and the secondary paths are connected.

However, the first path K1, the second path K2, the third path K3, and the connection portion J can be set in an area where the secondary path 1S and the primary path 1M are connected, as indicated by solid lines in FIG. 15. That is to say, a configuration may be employed in which the branching and merging portion B (B2) at which the connecting path from the primary path 1M to the secondary path 1S merges with the loop secondary path 1S is the connecting portion J, the loop secondary path 1S that is connected to the connecting portion J from the upstream side in the travel direction is the first path K1, the secondary path 1S (connecting path) that branches from the primary path 1M and is connected to the connecting portion J is the second path K2, and the loop secondary path 1S that is connected to the connecting portion J from the downstream side in the travel direction is the third path K3. In this case, the second station ST2 is the station ST that is installed in the first path K1 and at which the first article transport vehicle 31 stops.

Figure 16:
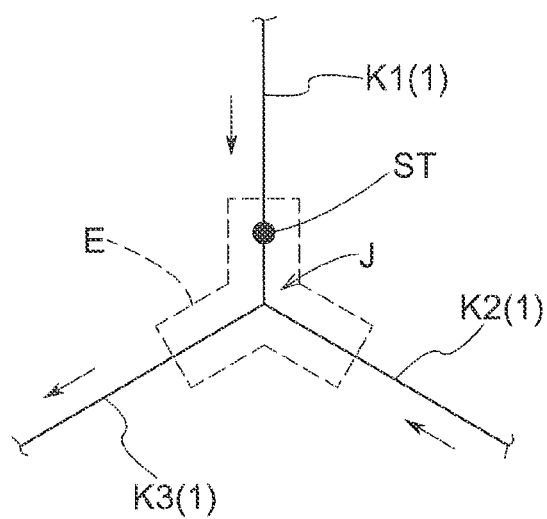
FIG. 16 is a conceptual diagram showing an example of the relationship between the first path, the second path, the third path, the connecting portion, the management zone, and the station.

Note that although the travel path 1 can take various modes, the first path K1, the second path K2, the third path K3, the connecting portion J, the management zone E, and the station ST need only have at least a configuration such as that shown in the conceptual diagram in FIG. 16. That is to say, the travel path 1 for the article transport vehicles 3 for transporting the articles W includes the first path K1 having an end portion connected to the connecting portion J, the second path K2 having an end portion connected to the connecting portion J, and the third path K3 having an end portion connected to the connecting portion J. A region including at least a portion of the first path K1, at least a portion of the second path K2, at least a portion of the third path K3, and the connecting portion J is set as the management zone E in which the passage of the article transport vehicles 3 is managed. A station ST at which each article transport vehicle 3 stops is provided in the management zone E. This station ST is provided at a position at which, in the first path K1 in the management zone E, an article transport vehicle 3 stopped at the station ST does not interfere with other article transport vehicles 3 traveling through the second path K2 and the third path K3.

Figure 17:
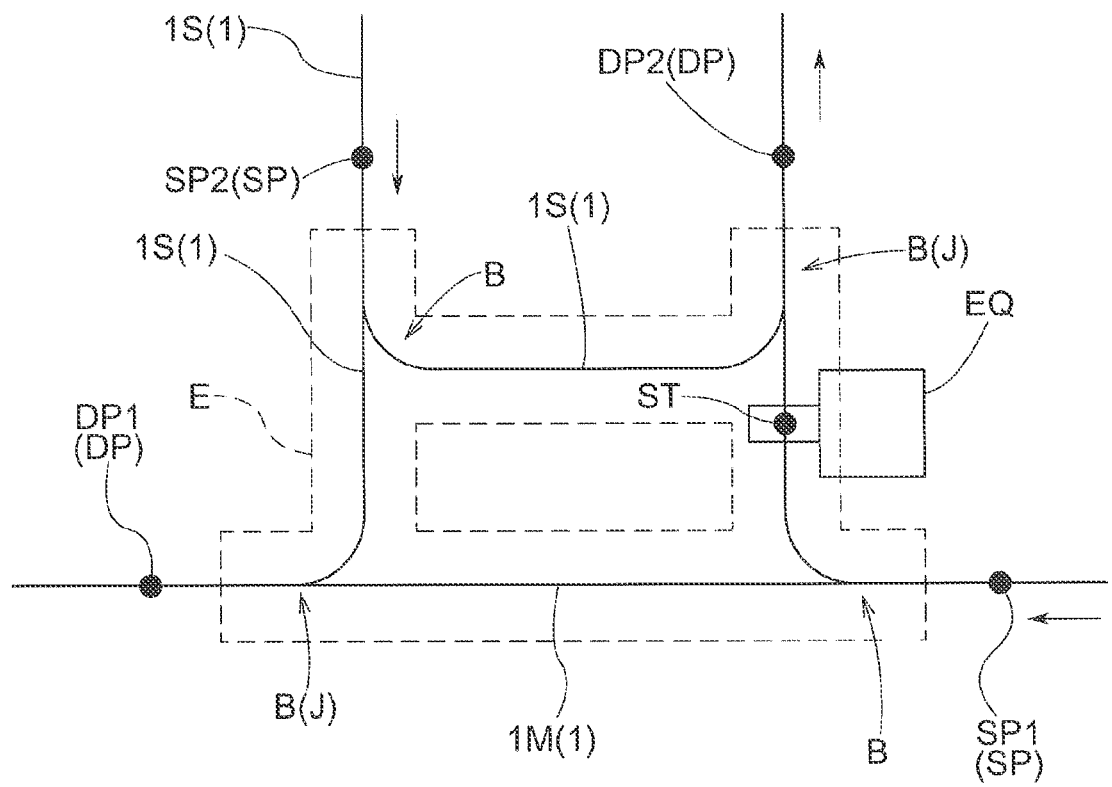
FIG. 17 is a diagram showing another example of the management zone in which the station is arranged.
Figure 18:
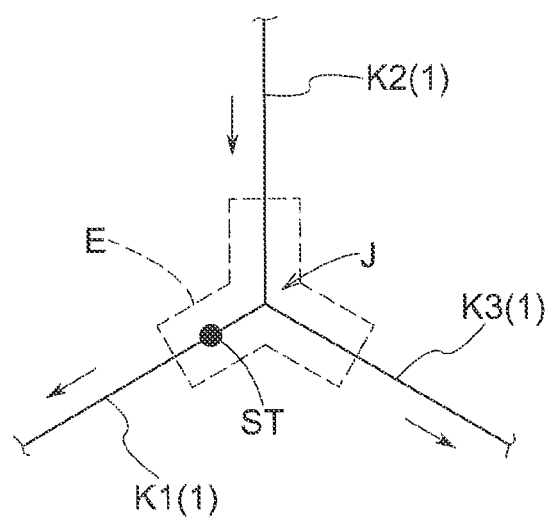
FIG. 18 is a conceptual diagram showing another example of the relationship between the first path, the second path, the third path, the connecting portion, the management zone, and the station.

Note that the case where the connecting portion J is a merging portion has been described above as an example, with reference to FIGS. 6, 9, 14, 15, 16, and so on. However, the connecting portion may alternatively be a branching portion as shown in FIGS. 17 and 18. FIG. 17 shows another example of the management zone E in which the station ST is arranged, in correspondence with FIG. 6. The conceptual diagram in FIG. 18 shows another example of the relationship between the first path K1, the second path K2, the third path K3, the connecting portion J, the management zone E, and the station ST, in correspondence with FIG. 16. Control performed by the zone management device H2 in the mode shown in FIGS. 17 and 18 can be easily inferred from the above description given with reference to FIGS. 1 to 16, and therefore a detailed description thereof is omitted.

Other Embodiments

Other embodiments will be described below. Note that the configuration of each embodiment described below is not only applied independently but may also be applied in combination with configurations of other embodiments unless a contradiction arises.

(1) The above description has been given to an example mode in which the first exception processing is executed if the first article transport vehicle 31 is stopped at the station. However, as mentioned above, if the article transport vehicle 3 enters the management zone E and thereafter stops at the station ST in the management zone E, there are cases where the article transport vehicle 3 can transmit, at the entry detection point SP, information that the article transport vehicle 3 is scheduled to stop to the zone management device H2, for example. In this case, before stopping at the station ST (e.g., when entering the management zone E), the first article transport vehicle 31 scheduled to stop at the station ST can notify the zone management device H2 that the first article transport vehicle 31 stops at the station ST. Accordingly, the first exception processing may be executed if the first article transport vehicle 31 is an article transport vehicle 3 scheduled to stop at the station. That is to say, "an article transport vehicle 3 that stops at the station" includes both concepts of "an article transport vehicle 3 stopped at the station" and "an article transport vehicle 3 scheduled to stop at the station".

(2) The above description has been given to an example configuration in which the travel path 1 is a one-way path, but the present invention is not limited thereto, and a part of or the entire travel path 1 may be a two-way path. In this case as well, since "the second article transport vehicle 32 passing through the second path K2 and the third path K3 but not passing through the first path K1 in which the station ST is set" is included in the conditions for the first exception processing, interference between the first article transport vehicle 31 stopped at the station ST and the second article transport vehicle 32 is avoided even if the first exception processing is executed.

(3) The above description has been given to an example mode in which the path-side communication unit S1 and the zone management device H2, the device-side communication unit S2 and the transfer control device H3, and the device-side communication unit S2 and the zone management device H2 are respectively wire connected using cables or the like, but these devices may alternatively be wirelessly connected using any of various types of wireless communication.

(4) The above description has been given to an example mode in which signals having the same meanings as those used in the communication between the path-side communication unit S1 and the transport vehicle-side communication unit S0 can be transmitted and received in the communication between the device-side communication unit S2 and the transport vehicle-side communication unit S0, and thus the article transport vehicle 3 stopped at the station ST communicates with the zone management device H2. However, not limited to this mode, the device-side communication unit S2 may communicate with the transport vehicle-side communication unit S0 in a mode of transmitting and receiving signals different from those used in the communication between the path-side communication unit S1 and the transport vehicle-side communication unit S0.

(5) The above description has been given to an example mode in which the article transport vehicle 3 stopped at the station ST communicates with the zone management device H2 as a result of the device-side communication unit S2 communicating with the transport vehicle-side communication unit S0, and the device-side communication unit S2 communicating with the zone management device H2. However, the article transport vehicle 3 may alternatively directly communicate with the zone management device H2 by means of wireless communication, for example, rather than via the device-side communication unit S2 provided at the station ST. That is to say, a configuration may alternatively be employed in which the zone management device H2 communicates with the transport vehicle-side communication unit S0 provided in the article transport vehicle 3, not via the device-side communication unit S2 provided at the station ST, detects a stop and a start of the article transport vehicle 3 at the station ST, and manages the passage of a plurality of article transport vehicles 3 including this article transport vehicle 3 in the management zone E. For example, the article transport vehicle 3 scheduled to stop at the station ST can also notify the zone management device H2 that the article transport vehicle 3 stops at the station ST, before stopping at the station ST (e.g., when entering the management zone E).

(6) The above description has been given to an example mode in which the station ST has the mounting platform 104 for transferring the article W, and each article transport vehicle 3 stops at the station ST in order to transfer the article W to and from the mounting platform 104. However, the station ST at which each article transport vehicle 3 stops is not limited to a station for transferring the article W, and the article transport vehicle 3 may stop at the station ST for a different reason from a transfer of the article W. For example, the station ST may be a car wash machine for washing each article transport vehicle 3, a maintenance robot for replacing the travel wheels 15, the guide wheels 16, or the like, or a place equipped with a device for inspecting the article transport vehicle 3. Alternatively, the station ST may be a place for replacing or charging a power storage device such as a battery provided in each article transport vehicle 3, or a place for updating a control program or the like of the article transport vehicle 3. Further, each article transport vehicle 3 is not limited to a vehicle for transporting the article W, and may alternatively be a maintenance vehicle, a cleaning vehicle, or the like.

(7) The above description has been given to an example in which each article transport vehicle 3 is a ceiling transport vehicle that is suspended and supported on the ceiling 101 side. However, each article transport vehicle 3 may alternatively be a transport vehicle that travels on the ground side in the case of an article transport facility in which the management zone is set in the travel path 1.

(8) In the above description, a FOUP and a reticle have been listed as examples of the article W to be transported, but the article W is not limited thereto and may be any other item.

Summary of Embodiment

The summary of the above-described article transport facility will be described below.

As one aspect, an article transport facility includes: a travel path for an article transport vehicle for transporting an article, the travel path including a first path having an end portion connected to a connecting portion, a second path having an end portion connected to the connecting portion, and a third path having an end portion connected to the connecting portion, wherein a region including at least a portion of the first path, at least a portion of the second path, at least a portion of the third path, and the connecting portion is set as a management zone in which passage of the article transport vehicle is managed; and a control device configured to perform control to manage the passage of the article transport vehicle in the management zone, wherein a station at which the article transport vehicle stops is provided in the management zone, the station is provided in the first path in the management zone, at a position at which the article transport vehicle stopped at the station does not interfere with another article transport vehicle that travels through the second path and the third path, and the control device can execute basic processing for permitting a first article transport vehicle, which is the article transport vehicle that first enters the management zone, to enter the management zone if no article transport vehicle is present in the management zone, and prohibiting a second article transport vehicle, which is another article transport vehicle, from entering the management zone if the first article transport vehicle is present in the management zone, and first exception processing for permitting the second article transport vehicle to enter the management zone in a case where, even if the first article transport vehicle is present in the management zone, the first article transport vehicle is the article transport vehicle that stops at the station, and the second article transport vehicle passes through the second path and the third path but does not pass through the first path.

According to this configuration, since exclusive control is executed such that only one article transport vehicle can enter the management zone due to the basic processing, interference between a plurality of article transport vehicles in the management zone can be appropriately prevented. Further, due to the first exception processing, the second article transport vehicle is allowed to enter the management zone even if the first article transport vehicle is present in the management zone. With only the basic processing, the second article transport vehicle needs to wait to enter the management zone until the first article transport vehicle that stops in the management zone exits the management zone, which prevents improvement of the transport efficiency in the article transport facility. However, according to this configuration, even if the first article transport vehicle is stopped in the management zone, the second article transport vehicle can pass through the management zone if the second article transport vehicle does not interfere with the first article transport vehicle in the management zone, and therefore the transport efficiency in the article transport facility can be improved. That is to say, according to this configuration, the transport efficiency of the article transport vehicles can be further improved in the article transport facility in which the article transport vehicles stop in the management zone in some cases.

Here, it is preferable that the control device executes second exception processing for prohibiting the first article transport vehicle from starting from the station until the second article transport vehicle exits the management zone after the second article transport vehicle has entered the management zone due to the first exception processing.

In a state where the first article transport vehicle is stopped at the station, there is no concern that the first article transport vehicle and the second article transport vehicle will interfere with each other, and therefore the second article transport vehicle travels in the management zone due to the first exception processing. Here, if the first article transport vehicle starts from the station while the second article transport vehicle is traveling in the management zone, a plurality of article transport vehicles travel at the same time in the management zone, and there is concern that the first article transport vehicle and the second article transport vehicle interfere with each other. Since a plurality of article transport vehicles are prohibited from traveling at the same time in the management zone by executing the second exception processing, the first article transport vehicle and the second article transport vehicle can be prevented from interfering with each other.

It is preferable that the control device detects the article transport vehicle entering the management zone, based on communication between a path-side communication unit arranged along the travel path and a transport vehicle-side communication unit provided in the article transport vehicle, and manages passage of a plurality of the article transport vehicles, including the detected article transport vehicle, in the management zone, and detects a stop and a start of the article transport vehicle at the station, based on communication between a device-side communication unit provided at the station and the transport vehicle-side communication unit provided in the article transport vehicle, and manages passage of a plurality of the article transport vehicles, including the article transport vehicle whose stop and start are detected, in the management zone.

There are cases where, at the station, the transport vehicle-side communication unit communicates with the device-side communication unit in order to control an operation performed by an article transport vehicle stopped at the station. The control device detects an article transport vehicle entering the management zone, based on the communication between the path-side communication unit and the transport vehicle-side communication unit. Although the first exception processing requires information that, for example, an article transport vehicle is stopped at the station, the device-side communication unit needs to be arranged at the station in order to control the operation performed by the article transport vehicle stopped at this station, and there are cases where it is difficult to arrange the path-side communication unit. According to this configuration, the control device detects, for example, a stop of the article transport vehicle at the station, based on the communication between the device-side communication unit and the transport vehicle-side communication unit. Accordingly, the control device can appropriately execute the first exception processing using the detection results.

It is preferable that the control device detects the article transport vehicle entering the management zone, based on communication between a path-side communication unit arranged along the travel path and a transport vehicle-side communication unit provided in the article transport vehicle, and manages passage of a plurality of the article transport vehicles, including the detected article transport vehicle, in the management zone, and communicates with the transport vehicle-side communication unit provided in the article transport vehicle, not via a device-side communication unit provided at the station, to detect a stop and a start of the articles article transport vehicle at the station and manage passage of a plurality of the article transport vehicles, including the article transport vehicle whose stop and start are detected, in the management zone.

The first exception processing requires information that, for example, an article transport vehicle is stopped at the station, or an article transport vehicle stops at the station. However, since the device-side communication unit needs to be arranged at the station in order to control the operation performed by the article transport vehicle stopped at this station, and there are cases where it is difficult to arrange the path-side communication unit. According to this configuration, the control device communicates with the transport vehicle-side communication unit provided in the article transport vehicle, not via the device-side communication unit provided at the station, and detects a stop of the article transport vehicle at the station, for example. Accordingly, the control device can appropriately execute the first exception processing using the detection results.

It is preferable that the station is set at a position at which the article is delivered to and from a processing device that uses the article to be transported by the article transport vehicle, and if a plurality of the stations are set for one processing device, one or more stations among the plurality of stations are in-zone stations located in the management zone, and remaining stations among the plurality of stations are out-of-zone stations located outside the management zone, the stations are managed such that the in-zone stations are less frequently used than the out-of-zone stations.

Since the first exception processing can be executed in addition to the basic processing, a decrease in the transport efficiency in the article transport facility can be suppressed even if an article transport vehicle stops at the station set in the management zone. However, if an in-zone station and an out-of-zone station are set for one processing device, it is possible to reduce the frequency of exclusive control performed in the management zone and suppress a decrease in the transport efficiency by preferentially using the out-of-zone station.

It is preferable that if the first article transport vehicle that stops at the station is present in the management zone, and waiting transport vehicles, each of which is the article transport vehicle waiting to enter the management zone, make requests to enter the management zone, the waiting article transport vehicles including a first waiting transport vehicle that travels through the first path and stops at the station, and a second waiting transport vehicle that passes through the second path and the third path via the connecting portion, the control device causes the second waiting transport vehicle to enter the management zone earlier than the first waiting transport vehicle if the requests to enter the management zone are made before the first article transport vehicle is enabled to start from the station, and causes the first waiting transport vehicle to enter the management zone earlier than the second waiting transport vehicle if the requests to enter the management zone are made after the first article transport vehicle has been enabled to start from the station.

If the second waiting transport vehicle is caused to first enter the management zone after the first article transport vehicle has exited the management zone, the first waiting transport vehicle cannot enter the management zone until the second waiting transport vehicle exits the management zone. That is to say, the entry of the first and second waiting transport vehicles into the management zone is exclusively managed due to the basic processing. However, when the first waiting transport vehicle is caused to first enter the management zone after the first article transport vehicle has exited the management zone, and the first waiting transport vehicle stops at the station, the second waiting transport vehicle can enter the management zone due to the first exception processing even if the first waiting transport vehicle is present in the management zone. That is to say, the first and second waiting transport vehicles can be present at the same time in the management zone, and therefore the transport efficiency in the article transport facility can be improved.

What is claimed is:
1. An article transport facility comprising:
a travel path for an article transport vehicle for transporting an article, the travel path comprising a first path having an end portion connected to a connecting portion, a second path having an end portion connected to the connecting portion, and a third path having an end portion connected to the connecting portion, wherein a region including at least a portion of the first path, at least a portion of the second path, at least a portion of the third path, and the connecting portion is set as a management zone in which passage of the article transport vehicle is managed; and
a control device configured to perform control to manage the passage of the article transport vehicle in the management zone,
wherein a station at which the article transport vehicle stops is provided in the management zone,
wherein the station is provided in the first path in the management zone at a position at which the article transport vehicle stopped at the station does not interfere with another article transport vehicle that travels through the second path and the third path,
wherein the station is set at a position at which the article is delivered to and from a processing device that uses the article to be transported by the article transport vehicle, and when a plurality of the stations are set for one processing device, one or more stations among the plurality of stations are in-zone stations located in the management zone, and remaining stations among the plurality of stations are out-of-zone stations located outside the management zone, the stations are managed such that the in-zone stations are less frequently used than the out-of-zone stations, and
wherein the control device executes:
basic processing for permitting a first article transport vehicle, which is the article transport vehicle that first enters the management zone, to enter the management zone when no article transport vehicle is present in the management zone, and prohibiting a second article transport vehicle, which is another article transport vehicle, from entering the management zone when the first article transport vehicle is present in the management zone, and
first exception processing for permitting the second article transport vehicle to enter the management zone in a case where, even when the first article transport vehicle is present in the management zone, the first article transport vehicle is the article transport vehicle that stops at the station, and the second article transport vehicle passes through the second path and the third path but does not pass through the first path.

2. The article transport facility according to claim 1, wherein the control device executes second exception processing for prohibiting the first article transport vehicle from starting from the station until the second article transport vehicle exits the management zone after the second article transport vehicle has entered the management zone due to the first exception processing.

3. The article transport facility according to claim 1, wherein the control device:
   detects the article transport vehicle entering the management zone based on communication between a path-side communication unit arranged along the travel path and a transport vehicle-side communication unit provided in the article transport vehicle, and manages passage of a plurality of the article transport vehicles, including the detected article transport vehicle, in the management zone, and
   detects a stop and a start of the article transport vehicle at the station based on communication between a device-side communication unit provided at the station and the transport vehicle-side communication unit provided in the article transport vehicle, and manages passage of a plurality of the article transport vehicles, including the article transport vehicle whose stop and start are detected, in the management zone.

4. The article transport facility according to claim 2, wherein the control device:
   detects the article transport vehicle entering the management zone based on communication between a path-side communication unit arranged along the travel path and a transport vehicle-side communication unit provided in the article transport vehicle, and manages passage of a plurality of the article transport vehicles, including the detected article transport vehicle, in the management zone, and
   detects a stop and a start of the article transport vehicle at the station based on communication between a device-side communication unit provided at the station and the transport vehicle-side communication unit provided in the article transport vehicle, and manages passage of a plurality of the article transport vehicles, including the article transport vehicle whose stop and start are detected, in the management zone.

5. The article transport facility according to claim 1, wherein the control device:
   detects the article transport vehicle entering the management zone, based on communication between a path-side communication unit arranged along the travel path and a transport vehicle-side communication unit provided in the article transport vehicle, and manages passage of a plurality of the article transport vehicles, including the detected article transport vehicle, in the management zone, and
   communicates with the transport vehicle-side communication unit provided in the article transport vehicle, not via a device-side communication unit provided at the station, to detect a stop and a start of the articles article transport vehicle at the station and manage passage of a plurality of the article transport vehicles, including the article transport vehicle whose stop and start are detected, in the management zone.

6. The article transport facility according to claim 2, wherein the control device:
   detects the article transport vehicle entering the management zone based on communication between a path-side communication unit arranged along the travel path and a transport vehicle-side communication unit provided in the article transport vehicle, and manages passage of a plurality of the article transport vehicles, including the detected article transport vehicle, in the management zone, and
   communicates with the transport vehicle-side communication unit provided in the article transport vehicle, not via a device-side communication unit provided at the station, to detect a stop and a start of the articles article transport vehicle at the station and manage passage of a plurality of the article transport vehicles, including the article transport vehicle whose stop and start are detected, in the management zone.

7. The article transport facility according to claim 1, wherein when the first article transport vehicle that stops at the station is present in the management zone, and waiting transport vehicles, each of which is the article transport vehicle waiting to enter the management zone, make requests to enter the management zone, the waiting article transport vehicles including a first waiting transport vehicle that travels through the first path and stops at the station, and a second waiting transport vehicle that passes through the second path and the third path via the connecting portion, and
wherein the control device:
   causes the second waiting transport vehicle to enter the management zone earlier than the first waiting transport vehicle when the requests to enter the management zone are made before the first article transport vehicle is enabled to start from the station, and
   causes the first waiting transport vehicle to enter the management zone earlier than the second waiting transport vehicle when the requests to enter the management zone are made after the first article transport vehicle has been enabled to start from the station.

* * * * *